US007279410B1

(12) United States Patent
Okada et al.

(10) Patent No.: US 7,279,410 B1
(45) Date of Patent: *Oct. 9, 2007

(54) METHOD FOR FORMING INLAID STRUCTURES FOR IC INTERCONNECTIONS

(75) Inventors: Lynne A. Okada, Sunnyvale, CA (US); Fei Wang, San Jose, CA (US); James Kai, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 536 days.

This patent is subject to a terminal disclaimer.

(21) Appl. No.: 10/379,757

(22) Filed: Mar. 5, 2003

(51) Int. Cl.
*H01L 21/4763* (2006.01)
*H01L 21/44* (2006.01)
*H01L 21/311* (2006.01)

(52) U.S. Cl. .................. 438/618; 438/622; 438/624; 438/634; 438/637; 438/638; 438/672; 438/675; 438/700

(58) Field of Classification Search ........... 438/618, 438/622, 624, 634, 637, 638, 672, 675, 700; 257/758, 760
See application file for complete search history.

(56) References Cited

U.S. PATENT DOCUMENTS

| 5,578,523 A * | 11/1996 | Fiordalice et al. ........... 438/633 |
| 5,635,423 A * | 6/1997 | Huang et al. ............... 438/638 |
| 5,741,626 A * | 4/1998 | Jain et al. .................. 430/314 |
| 5,801,094 A * | 9/1998 | Yew et al. ................... 438/624 |
| 5,920,790 A * | 7/1999 | Wetzel et al. ............... 438/618 |
| 6,127,089 A | 10/2000 | Subramanian et al. |
| 6,153,514 A | 11/2000 | Wang et al. |
| 6,156,643 A | 12/2000 | Chan et al. |
| 6,159,661 A * | 12/2000 | Huang et al. ............... 430/313 |
| 6,177,364 B1 * | 1/2001 | Huang ........................ 438/792 |
| 6,180,507 B1 * | 1/2001 | Lan ............................. 438/618 |

(Continued)

OTHER PUBLICATIONS

"Accelerator for Microelectronics and Semiconductor Innovation—Damascene Technology", Cyberfab.net, 8 pgs., taken from the Internet at http://www.cyberfab.net/training/selfstudy/damascene_technology_1.html.

(Continued)

*Primary Examiner*—David E. Graybill
(74) *Attorney, Agent, or Firm*—Farjami & Farjami LLP (57) ABSTRACT

A method for forming an inlaid interconnect structure for ICs. The method includes forming an etch stop layer, opening a portion of the etch stop layer on an IC die, forming a dielectric layer and cap layer over the etch stop layer, forming a photoresist pattern, and etching the cap and dielectric to form an opening that is then filled with a conductive material (e.g., metal). The method may further include forming a barrier layer within the opening of the etch stop layer. According to another aspect of the invention, a first and second etch stop layer are formed over the substrate and the second etch stop layer is patterned to define two regions, wherein a second region having the first and second etch stop layers experiences a faster etch rate than the first region. The dielectric layer and cap layers are then deposited over both regions and two via or trench openings are formed therethrough in the regions, respectively. The first and second etch stop layers protect the underlying substrate from experiencing punchthrough during the via or trench formation. The etch stop layers are then removed in the openings and a conductive material is formed therein.

12 Claims, 11 Drawing Sheets

U.S. PATENT DOCUMENTS

| | | |
|---|---|---|
| 6,204,168 B1 | 3/2001 | Naik et al. |
| 6,207,576 B1 | 3/2001 | Wang et al. |
| 6,207,577 B1 | 3/2001 | Wang et al. |
| 6,211,061 B1 * | 4/2001 | Chen et al. ............. 438/622 |
| 6,235,628 B1 | 5/2001 | Wang et al. |
| 6,255,735 B1 | 7/2001 | Wang et al. |
| 6,291,887 B1 | 9/2001 | Wang et al. |
| 6,294,458 B1 | 9/2001 | Zhang et al. |
| 6,312,874 B1 | 11/2001 | Chan et al. |
| 6,350,675 B1 * | 2/2002 | Chooi et al. ............ 438/624 |
| 6,358,838 B2 | 3/2002 | Furusawa et al. |
| 6,365,505 B1 | 4/2002 | Wang et al. |
| 6,368,979 B1 | 4/2002 | Wang et al. |
| 6,507,081 B2 | 1/2003 | Smith et al. |
| 6,600,333 B1 * | 7/2003 | Martin et al. ............ 324/765 |
| 6,627,539 B1 * | 9/2003 | Zhao et al. .............. 438/638 |
| 6,767,827 B1 * | 7/2004 | Okada et al. ............ 438/638 |
| 2002/0192944 A1 | 12/2002 | Sonderman et al. |
| 2002/0195715 A1 | 12/2002 | Cho |
| 2003/0008243 A1 | 1/2003 | Ahn et al. |

OTHER PUBLICATIONS

"Damascene Copper Electroplating for Chip Interconnections", Electrochemical Microfabrication, P. C. Andricacos, C. Uzoh, J. O. Dukovic, J. Horkans and H. Deligianni, vol. 42, No. 5, 1998, 6 pgs., taken from the Internet at: http://www.research.itm.com/journal/rd/425/adnricacos.html.

"Tutorial on On-Chip Interconnect for non-experts", The Microelectronics Training Center, Bart De Mey, Feb. 2001, 2 pgs.

* cited by examiner

METHOD FOR FORMING INLAID STRUCTURES FOR IC INTERCONNECTIONS

FIELD OF THE INVENTION

This invention relates generally to semiconductor processing, and more particularly to a method and process for single inlaid structures for integrated circuit interconnections.

BACKGROUND OF THE INVENTION

Integrated circuits (ICs) are formed on semiconductor substrates using a number of different processing steps to create transistor and interconnection elements. In order to electrically connect transistor terminals associated with the semiconductor substrate, conductive (e.g., metal) vias (vertical channels) and interconnections (interconnects) are formed in dielectric (electrically insulating) materials as part of the integrated circuit. The vias and interconnects couple electrical signals and power between transistors, internal circuits of the IC, and circuits external to the IC.

Inlaid ("damascene") interconnect processes for semiconductor devices are replacing conventional "blanket" metal deposition and etch processes. Traditionally, metal films have been deposited and patterned using photolithography techniques to form patterned metal interconnects overlying a semiconductor substrate. As interconnect geometry sizes decrease and as conductive lines are formed closer and closer together, it becomes increasingly difficult to accurately pattern the conductive lines and form the conductive interconnects using the traditional blanket deposition and patterning processes. Consequently, inlaid metal interconnect processes have been developed to overcome some of these problems.

In conventional inlaid metal interconnect processing, an interlayer dielectric (ILD) layer and a cap layer (or "hard mask" to protect the ILD layer) are deposited on an etch stop layer (ESL) overlying the semiconductor substrate. A photoresist mask is then patterned on the ILD layer and cap layers and etched to form vias or openings in the ILD layer and cap layers. The ESL formed below the ILD layer serves to stop the etch. The photoresist is then removed and another etch is performed to remove the ESL within the via prior to filling the via with metal. A blanket layer of metal, for example, copper, is then deposited across the surface to completely fill the vias. The blanket metal layer is then polished back from the surface of the ILD layer and cap layers, for example by chemical mechanical polishing (CMP), leaving the metal interconnects only in the via areas and isolated by the ILD layers.

Removing the ESL layer from the vias prior to filling them with metal with traditional inlaid etch processing creates several deleterious effects. In particular, when the ESL layer is etched from the vias, the cap layer is also etched to some degree, causing the corners of the cap layer to become rounded. The cap layer must therefore be thick enough to survive the ESL etch and protect the underlying ILD layer. Utilizing a thick cap layer, however, comes at the expense of the dielectric constant ("k") of the "stack" (i.e., the layers of the ESL, ILD, and cap). As interconnect geometries become denser, it is important that the overall stack is composed of materials with low dielectric constants to prevent capacitance coupling and "cross talk" between interconnect patterns. Because the thickness of the cap layer depends, in part, on surviving the ESL etch, the cap layer may not be optimized to have the lowest stack dielectric constant.

Additionally, after the vias are filled with the metal layer, the surface must be polished back to the cap layer in order to remove the metal from the surface and isolate the interconnect patterns. Corner rounding of the cap layer may require additional polishing to insure isolation of the interconnect patterns. The additional polishing may damage the underlying ILD layers. As interconnect patterns become more dense, corner rounding of the cap layer leads to increasingly thick cap layers to compensate for the additional polishing needed to isolate the interconnect features. Furthermore, this increased cap thickness adds additional complications for patterning since advanced lithography processing is moving toward use of thinner resists. As a result, photoresist consumption becomes a greater concern. This issue is especially exacerbated by the need to transition from 248 nm photoresist to 193 nm photoresist, which is inherently less robust to the etch process.

Further, the ESL etch may cause ILD attack and modification of the ILD sidewalls. This attack on the ILD layer sidewalls may lead to a higher dielectric constant and decreased performance of the interconnect patterns. Also, under-layer sputtering of copper on the ILD layer sidewalls may increase electromigration and leakage of copper within the structure.

A further problem of conventional inlaid metal processing is the feature dependent loading effect during the cap and ILD etches. Certain areas, such as near the die seal or lithography alignment marks can etch significantly faster than in other areas. This difference in etch rate can lead to ESL breakthrough during the ILD etch, resulting in a build-up of charge in the areas that etch more quickly. This could result in conductor charging and explosion.

Each of these above mentioned concerns are also applicable to trench patterning in inlaid processing.

Therefore, a method and process for single inlaid processing is desired that allows for optimal thickness of the cap material to minimize the dielectric constant of the stack, requiring less polishing to isolate features and allows for the extended use of single layer photoresists. It is also desired to provide a method that minimizes ILD attack and modification, and prevents under-layer copper sputtering on the ILD sidewalls to improve the dielectric constant and electromigration performance of the stack. Further, it is desired to optimize the ESL thickness for electromigration performance, decreased stack dielectric constant, and prevent possible etch through of the ESL layer during the ILD etch.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later.

According to one embodiment of the present invention, a method is provided for forming a single inlaid structure for an IC interconnect. The method includes forming an etch stop layer over an integrated circuit substrate structure, forming an opening in a portion of the etch stop layer, and forming a layer of dielectric material and cap material over the etch stop layer and the opening formed in the etch stop layer. The method further includes forming a photoresist pattern over the cap layer, etching the cap layer and the layer of dielectric material to form a via or trench using the photoresist pattern, and filling the via or trench with a conductive material, for example, metal. According to another aspect of the present invention, the methodology includes forming openings in the dielectric and cap materials that are aligned substantially with the etch stop layer openings, and filling the opening with a conductive material, for example, metal.

The method for forming the inlaid structure may further include forming a barrier layer within the opening of the etch stop layer prior to forming the layer of dielectric material over the etch stop layer, and removing a portion of the barrier layer that does not fill the exposed etch stop layer opening. The barrier layer comprises, for example, tantalum, and the dielectric material comprises SiLK or another material with a dielectric constant of approximately 3.0 or less, for example. The cap layer has a thickness of, for example, less than about 2000 A. The photoresist mask used to etch the cap layer and the interlevel dielectric (ILD) layer is, in one example, a single layer, and the pattern of the photoresist is, in one example, aligned with openings of the etch stop layer. The conductive material filling the via or trench comprises, for example, copper.

According to another aspect of the present invention, a method is provided for forming an integrated circuit interconnect structure. The method includes forming a first etch stop layer on an integrated circuit structure, forming a second etch stop layer (ESL) on the first etch stop layer, patterning the second ESL so that it remains in the areas on the die that due to the feature dependent loading effect, for example, etch quickly. A layer of dielectric material is then formed over the first ESL and the second patterned ESL, and a cap layer is formed over the layer of dielectric material. A photoresist mask is then formed over the cap layer, and the cap, dielectric material, and ESLs are etched using the photoresist mask to form a via. The via is then filled with a conductive material.

The method may further include etching the first and second etch stop layers from the pattern where the first and second etch stop layers may be the same or different materials. The first etch stop layer may have a lower dielectric constant than the second etch stop layer, and the thickness of the first etch stop layer may further be based upon the electromigration performance of the first etch stop layer material.

All examples of the present invention highlighted herein are applicable to both via and trench damascene patterning, and both such processes are contemplated as falling within the scope of the present invention.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the present disclosure, like objects that appear in more than one figure are provided with like reference numerals.

DETAILED DESCRIPTION OF THE INVENTION

In accordance with the present invention, a method is provided for forming a single inlaid structure. In one aspect of the present invention, the method reduces corner rounding and ILD layer attack within the via or trench during an ESL etch. The above advantage is achieved by opening the etch stop layer prior to the deposition of the ILD and cap layers and the formation of the via or trench patterns. Further, the opening of the ESL is filled with a barrier layer in another aspect of the present invention to improve electromigration and reduce the need for precise alignment of the ESL and via or trench patterns.

Additional aspects of the present invention reduce the probability of etching through the ESL and allow for an improved dielectric constant of the stack. In one aspect, the reduced probability of ESL etch-through is achieved by using a first and second ESL. Specifically, the advantage is achieved by patterning the second ESL to remain only in areas where the etch occurs more quickly. This aspect of the invention allows for protection of the fast etching areas without the need to increase the ESL thickness in all areas of the die. Further, the dielectric constant of the stack may be improved by having the option to choose the first ESL material and thickness based on its dielectric constant and electromigration performance and the second ESL based on its ability to stop the etch. Further, use of a second ESL will not impact the dielectric constant of the resultant stack since it is removed during the etch process.

Examples of the invention described herein are for exemplary purposes only and are not intended to be limiting.

The present method provides benefits over conventional single inlaid methods. As will be appreciated in the discussion to follow, the cap layer, or hard mask, may be thinned to improve the overall dielectric constant of the stack as well as minimize any over-polishing necessary to isolate features due to corner rounding when opening the etch stop layer. The ILD sidewalls undergo less under-layer metal sputtering, and such reduction may improve electromigration performance and minimize modification of the low dielectric constant of the ILD layer. Further, a thin single layer of photoresist may be used to etch the thinned cap layer and ILD layers resulting in extended use of current single resist layer patterning technology.

FIGS. 1 and 2A-2E illustrate an exemplary method 100 for a single inlaid structure according to one aspect of the present invention. While the exemplary method is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method may be implemented in association with the apparatus and systems illustrated and described herein as well as in association with other systems not illustrated.

Figure 1:
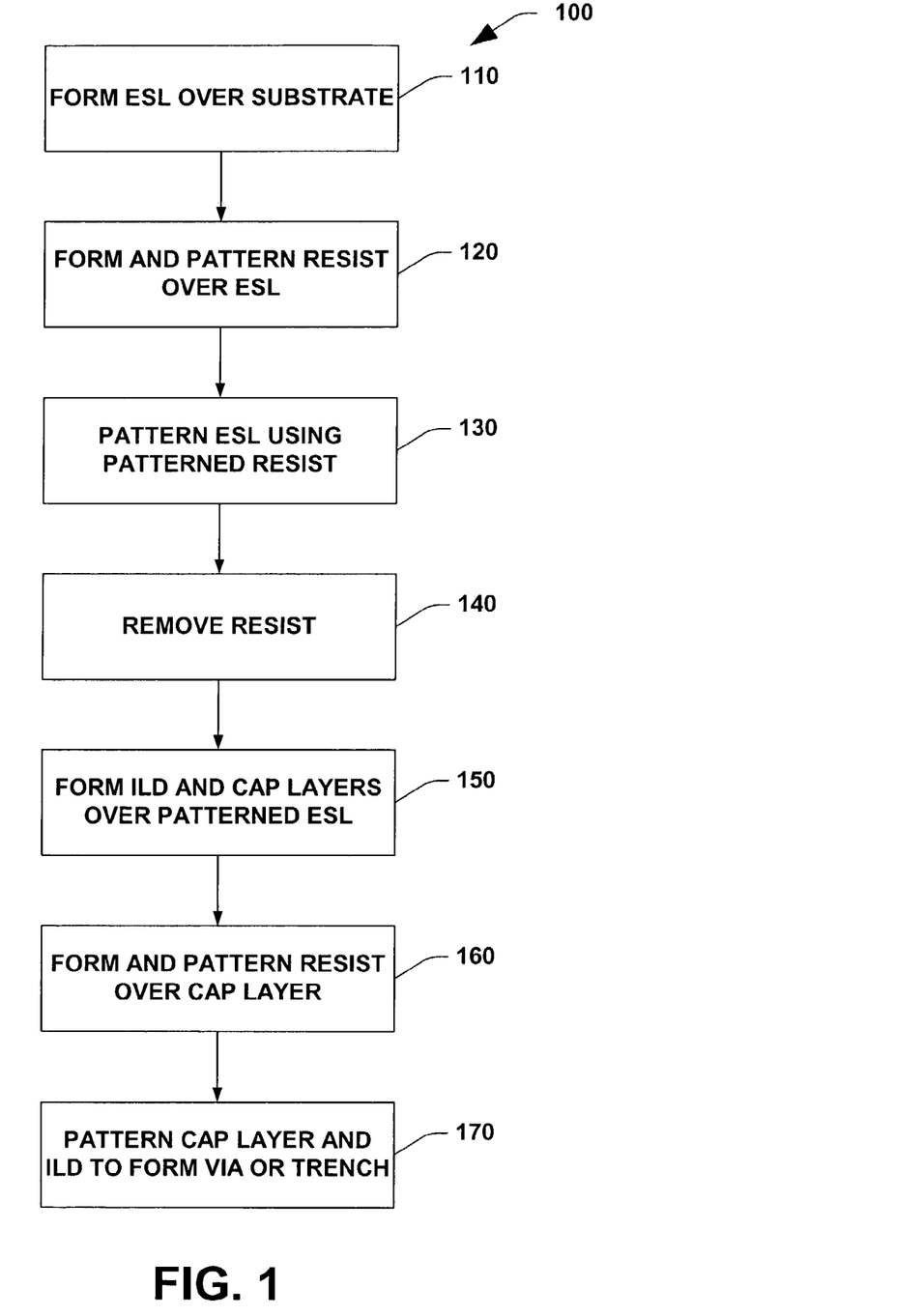
FIG. 1 is a flow chart diagram illustrating an exemplary method for forming a single inlaid structure according to an aspect of the present invention.

Referring initially to FIG. 1, the method 100 comprises forming an ESL over a substrate at 110. The substrate may comprise, for example, an underlying dielectric layer having one or more conductive structures residing therein. A photoresist is then formed over the ESL at 120, for example, via spin-coating. The photoresist is also patterned at 120, for example, by selectively exposing the photoresist to radiation followed by development thereof according to known techniques. The portion of the ESL exposed by the patterned photoresist is then patterned at 130 using the patterned photoresist as a mask. In one example, the ESL is patterned at 130 via a dry etch process that is substantially selective to the underlying substrate material which may be, for example, copper or tungsten. The patterned photoresist is then removed at 140.

The method 100 of FIG. 1 continues at 150, wherein an ILD and cap layer are formed over the patterned ESL in succession. A photoresist layer is then formed over the cap layer at 160 and patterned to have an opening therethrough that generally corresponds to the opening within the underlying ESL. The cap layer and the ILD layer are then patterned via, for example, a dry etch process at 170 to form a via or trench therethrough. The process 100 may then continue by the deposition of a conductive material into the via or trench (not shown), followed by a planarization process, for example, CMP.

Figure 2A:
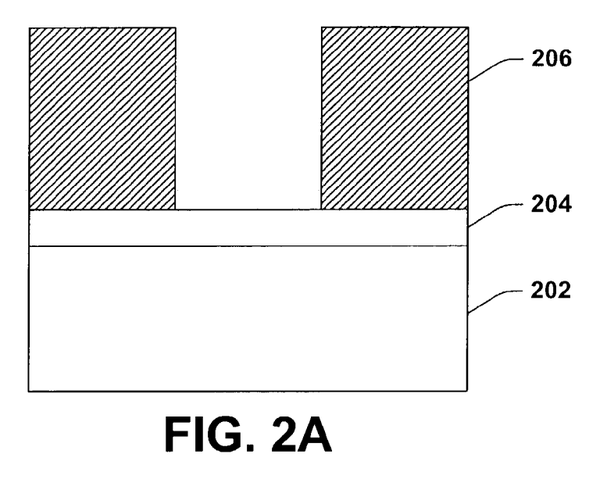
FIGS. 2A through 2E are fragmentary cross section diagrams illustrating an exemplary method for forming a single inlaid structure according to FIG. 1.

In FIG. 2A an etch stop layer, ESL 204, is formed over a substrate 202 in a conventional manner. The ESL 204 traditionally serves to stop the etch from etching into the substrate 202 and prevents copper migration or diffusion. The substrate 202 comprises, for example, another formed layer on a semiconductor substrate (die) or other integrated circuit structures such as an IC die with transistor regions therein overlain by a transistor gate layer. The ESL 204 comprises, for example, silicon nitride (SiN), silicon carbide (SiC), silicon carbide nitride (SiCN), or any other suitable materials known in the art to prevent copper migration and with a different etch selectivity than the subsequent ILD layer. For example, the ESL 204 may comprise BLOk, an etch stop film manufactured by Applied Materials, Inc., and conventionally applied to a thickness of about 500 Å. A photoresist layer 206 is then formed and patterned in a conventional manner over the ESL 204 to define an opening 207 that will be formed in the ESL 204. The photoresist 206 can be of a standard thickness, but a very thin photoresist layer of, for example, about 500-2000 Å, in this first masking step may be preferred to minimize copper oxidation, sputtering and damage during the photoresist removal.

Figure 2B:
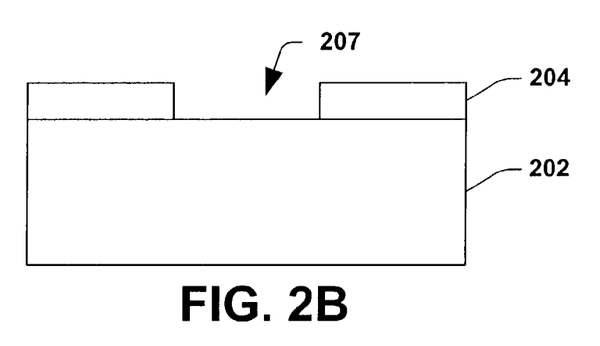

FIG. 2B illustrates the ESL 204 having the opening 207 therein after a subsequent ESL etch using a fluorocarbon dry etch process and stripping off the remaining photoresist layer. As shown, the ESL 204 is opened in the area where the via or trench will be formed. In contrast to conventional methods, the ESL 204 is opened prior to the deposition of an ILD layer (and cap layer) on the ESL 204. The thickness of the ESL 204 is therefore determined primarily by its copper diffusion properties and not its ability to stop the etch. The thickness of the ESL 204 is, for example, in the range of about 300-700 Å.

Figure 2C:
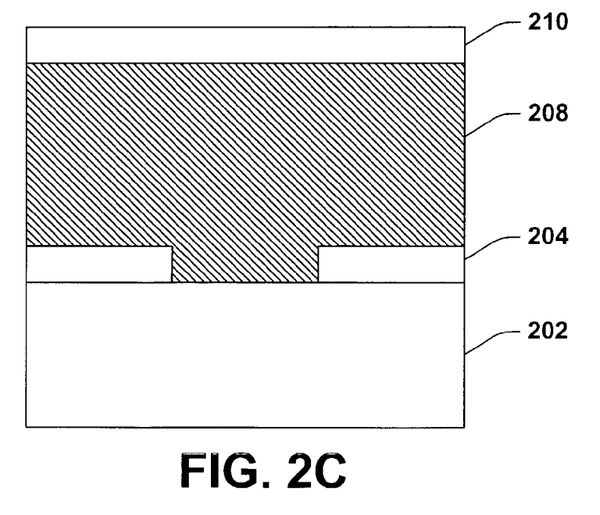

Next, a conventional interlayer dielectric (ILD) layer 208 and a conventional cap layer 210 are deposited over the ESL 204 and the substrate 202 in FIG. 2C. The ILD 208 comprises, for example, silicon dioxide ($SiO_2$), an inorganic MSQ-based material, an organic polymer, or other known dielectric material, such as SiLK®, a dielectric polymer manufactured by Dow Chemical Company. The material of the ILD layer 208 is generally chosen to minimize the dielectric constant of the stack, comprising the ESL 204, ILD 208, and cap layer 210. A high dielectric constant may undesirably cause capacitance coupling or "cross talk" between features as the interconnect density is increased. A dielectric constant value of less than 3.0 is generally desired for the ILD layer 208.

The cap layer 210 can be formed thinner than with conventional inlaid structures in the present invention because the cap layer does not have to survive the stop layer etch to create the opening 207 in the ESL 204 because the ESL has already been patterned. For example, conventional cap layers have a thickness of about 2000-3000 Angstroms, however, the present invention provides for a cap thickness in the range of about 700-2000 Angstroms, thereby significantly easing the etch selectively requirement to photoresist. The cap layer 210 comprises, for example, silicon dioxide ($SiO_2$), silicon oxynitride (SiON), or silicon carbide (SiC), but is not limited to these materials. The cap layer 210 may also comprise two or more layers, for example, an oxide layer over a silicon oxynitride layer. A thin cap layer 210 is desirable because the cap layer material generally has a higher dielectric constant than the ILD layer 208. In conventional processes, the cap layer is rounded at the corners of the via or trench by the eventual ESL etch. The corner rounding effect of the cap requires more polishing to remove the metal layer and isolate the interconnect features. The corner rounding further requires the cap layer 210 to be formed of sufficient thickness to survive the ESL etch. Therefore, the method and process of the present invention allows one to optimize the cap layer thickness, material, etc. for low dielectric constant values that is otherwise compromised because of the corner rounding caused by the ESL etch. A further advantage of the thinner capping stack is a less stringent photoresist etch selectivity requirement. This is especially advantageous as resist thickness and the resist resistance to the etch process is reduced (e.g., transitioning to 193 nm photoresist from 248 nm photoresist).

Figure 2D:
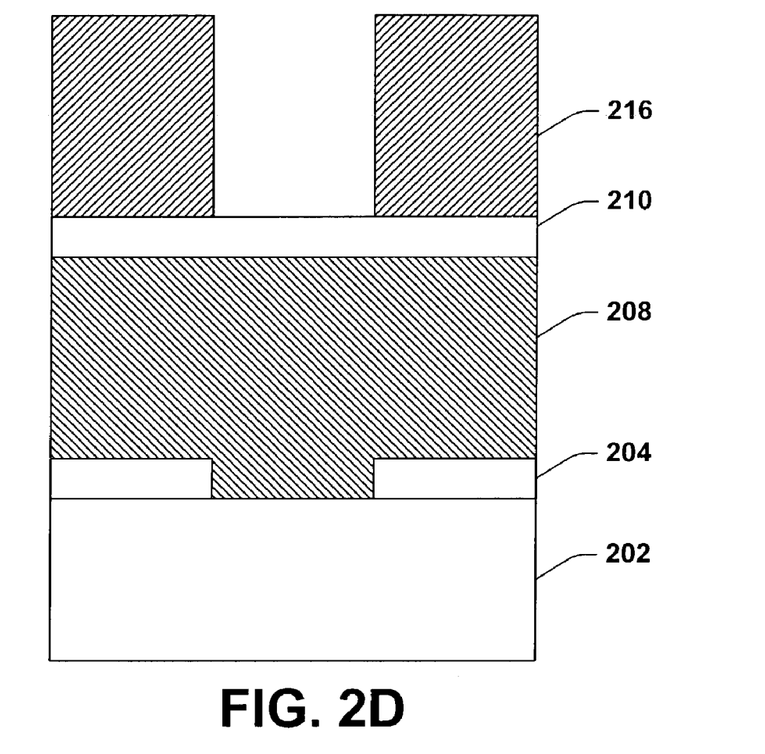

A second photoresist 216 is then formed and patterned in a conventional manner over the cap layer 210 in FIG. 2D. It is advantageous to align the photoresist 216 with the opening 207 in the ESL 204 to define the opening in the via and prevent subsequent copper migration (to align the first and second openings). Further, because the etch that will be performed using the patterned photoresist 216 does not have to etch the ESL 204, a single layer photoresist pattern may be used to etch and form a completed via or trench. In contrast, conventional methods may require multiple photo resist layers (e.g., a bilayer resist) and additional etch processing to complete the patterning.

Figure 2E:
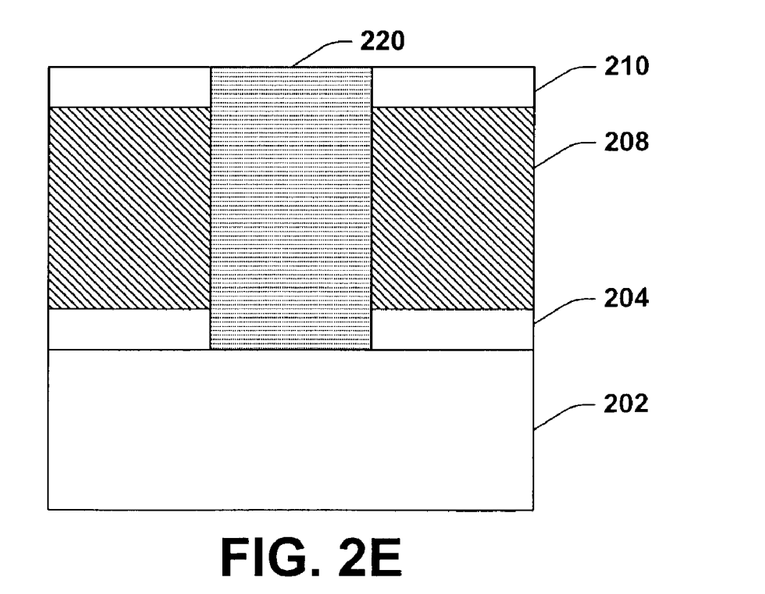

In FIG. 2E the cap layer 210 and the ILD layer 208 are etched to form the via or trench using a fluorocarbon based dry etch process followed by photoresist or organic dielectric removal, if applicable. Typical organic etch processes are either reducing in nature (e.g., utilizing $H_2$ and $N_2$) or oxidizing (e.g., using $N_2$ and $O_2$).

Finally, as with the conventional damascene methods, a layer of conductive material 220 is then deposited over the patterned dielectric layer 208 and cap layer 210 and into the vias or trenches, filling the structures. A barrier layer and seed layer (not shown) may also be deposited over the structure prior to the conductive material 220 deposition. Any conductive material 220 on the surface of the cap layer and not in the vias or trenches is then removed, leaving the desired pattern of interconnects. Conductive material 220 is removed, for example, by chemical mechanical polishing (CMP) or other conventional methods. Removing conductive material 220 from the surface isolates the vias or trenches. Conductive material 220 is, for example, copper or other suitable conductive material known in the art.

FIGS. 3 and 4A-4G illustrate an exemplary method for a single inlaid structure according to another aspect of the present invention. This example, in addition to the advantages of the first example described above, confines sputtered under-layer material (e.g., copper) between two barrier materials to reduce electromigration and leakage. Further, this embodiment improves stack performance (i.e., a lower stack dielectric constant) because the ESL thickness of this example does not depend upon the etch stop capability of the ESL.

Figure 3:
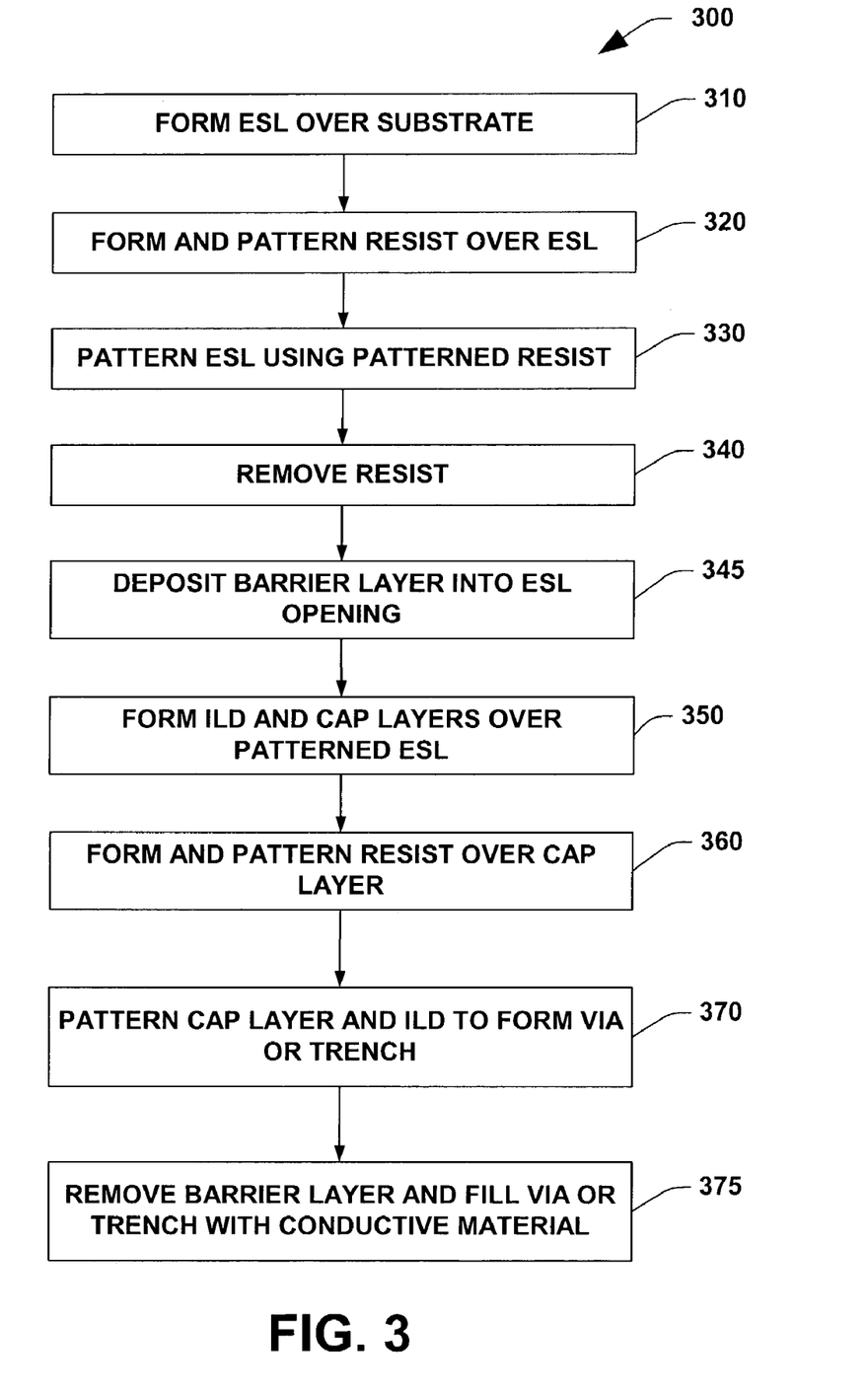
FIG. 3 is a flow chart diagram illustrating an exemplary method for forming a single inlaid structure according to another aspect of the present invention.

FIG. 3 represents a method 300 that is similar in many respects to the method 100 of FIG. 1. That is, acts 310-340 follow the acts 110-140, wherein an ESL layer is formed and patterned using a photoresist that is subsequently removed. Once the photoresist is removed at 340, a barrier layer is deposited into the ESL opening at 345. The method 300 then proceeds at 350-370 in a manner similar to acts 150-170 in the method 100, wherein the ILD and cap layers are formed and patterned with a patterned photoresist serving as a mask to form a trench or via therethrough. Preferably, the trench or via is aligned substantially with respect to the barrier layer such that the barrier layer may then be removed, followed by a filling of the trench or via with a conductive material at 375. Alternatively, the barrier may be left in the opening and the conductive material covers the barrier with the trench or via.

Figure 4A:
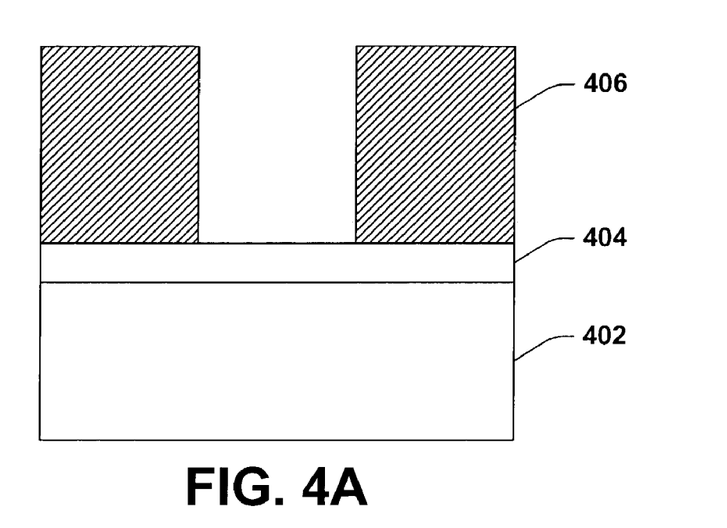
FIGS. 4A through 4G illustrate are fragmentary cross section diagrams illustrating an exemplary method for forming a single inlaid structure according to FIG. 3.
Figure 4B:
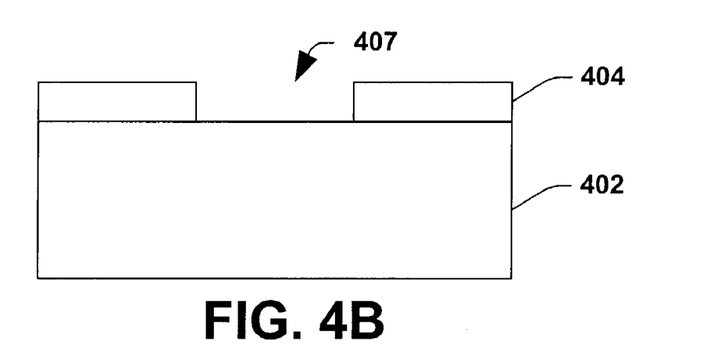

Turning to FIGS. 4A-4G, the method 300 may be appreciated in greater detail in accordance with an example. In FIG. 4A an etch stop layer, the ESL 404, is formed over a substrate 402, and a photoresist 406 is patterned over the ESL 404. Similar to the first example, the ESL 404 is etched to form an opening 407 in the ESL 404, and the photoresist 406 is stripped in FIG. 4B.

Figure 4C:
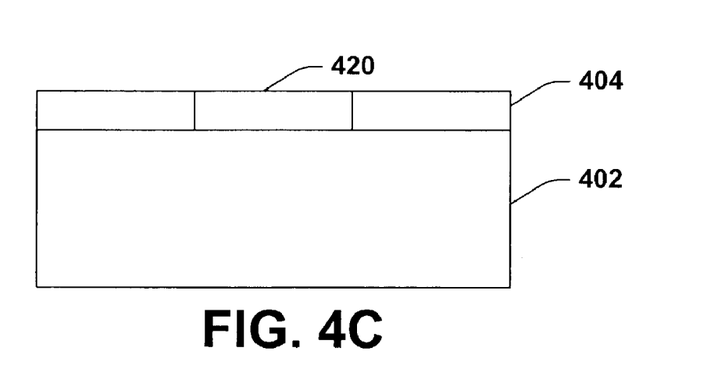

In FIG. 4C a barrier layer such as a tantalum (Ta) layer 420 is deposited within the opening 407 formed in the ESL 404. The Ta layer 420 is, for example, about 300-2000 Å thick, and serves as a barrier layer that prevents copper diffusion and also serves to protect the underlying copper from being sputtered or damaged during subsequent processing. The Ta layer 420, in one example, can be formed over the entire surface of the structure and then polished back such that it is only within the opening 407 of the ESL 404. This example offers similar advantages over conventional methods because the Ta layer 420 provides confinement for any under-layer copper sputtering on the sidewalls and may cause less damage to the ILD sidewalls if it is removed. This reduces potential electromigration and leakage caused by copper diffusion and preserves the low dielectric constant of the stack. Other materials, such as tantalum alloys, titanium nitride, selective tungsten silicon nitride (WSiN) electro-deposition, cobalt tungsten phosphorus (CoWP), or cobalt tungsten boron (CoWB) depositions may be used in addition to or instead of the Ta layer 420 as barriers. Any barrier material that provides the above functionality may be employed and is contemplated as falling within the scope of the present invention.

Figure 4D:
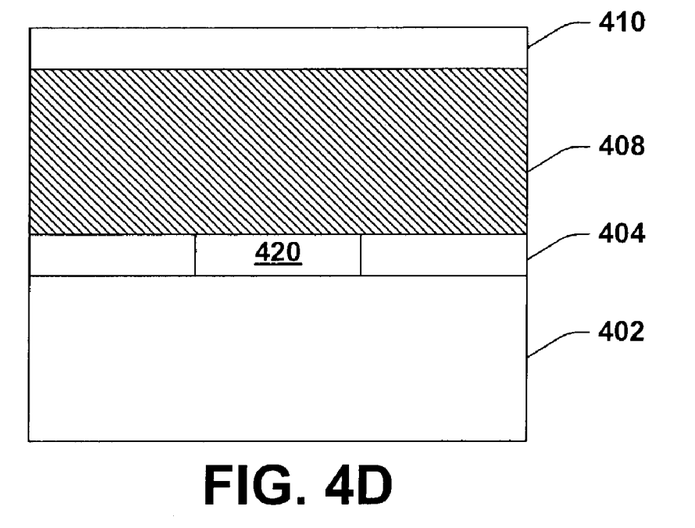
Figure 4E:
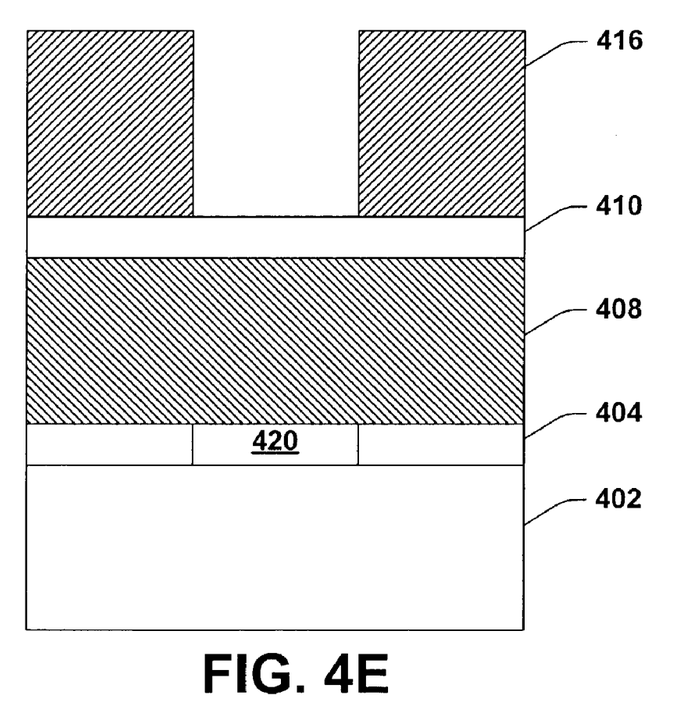

The ILD layer 408 and the cap layer 410 are then deposited in FIG. 4D over the ESL 404 and the Ta layer 420. These depositions are followed by the photoresist 416 pattern formed over the cap layer 410 in FIG. 4E. The ILD layer 408, cap layer 410, and photoresist layer 416 can all be similar materials as described above with respect to the first example.

Figure 4F:
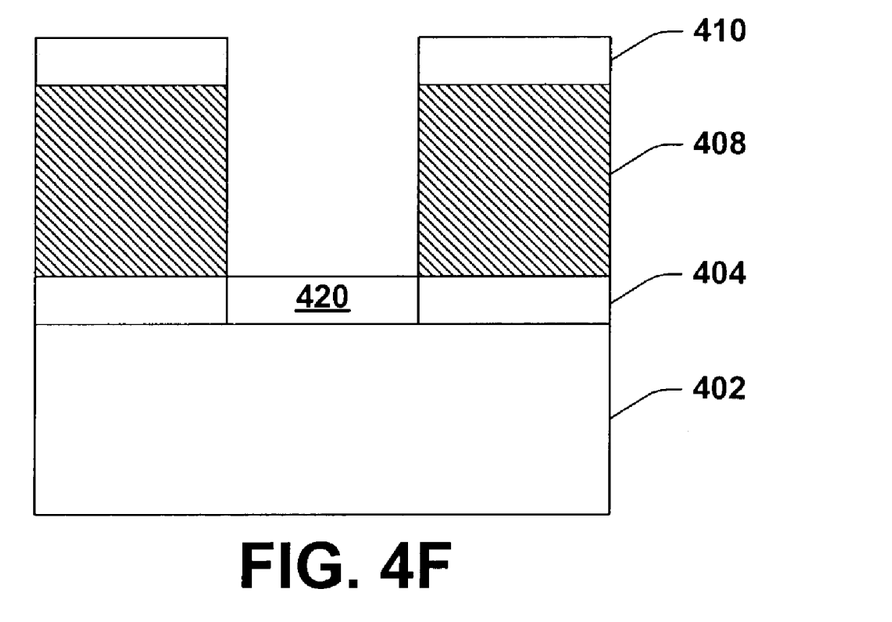

A cap and ILD etch are then performed in FIG. 4F followed by the removal of the photoresist 416 from the cap layer 410. The Ta layer 420 may then be etched in FIG. 4G, or optionally be left in place. The Ta layer 420, or other suitable material, can be etched away without degrading the cap layer 410 as severely as in the case of removing the ESL 404 from the via or trench with conventional methods. Further, the importance of aligning the cap layer 410 and the ILD layer 408 etch (the trench or via) with the ESL opening 407 is reduced compared to the first example because the addition of the Ta layer 420 will serve as a barrier to copper migration if the second etch is offset with respect to the opening 407 of the ESL layer 404. One method to achieve selectivity of the Ta etch to the inorganic or organic materials is by wet chemical methods.

Figure 4G:
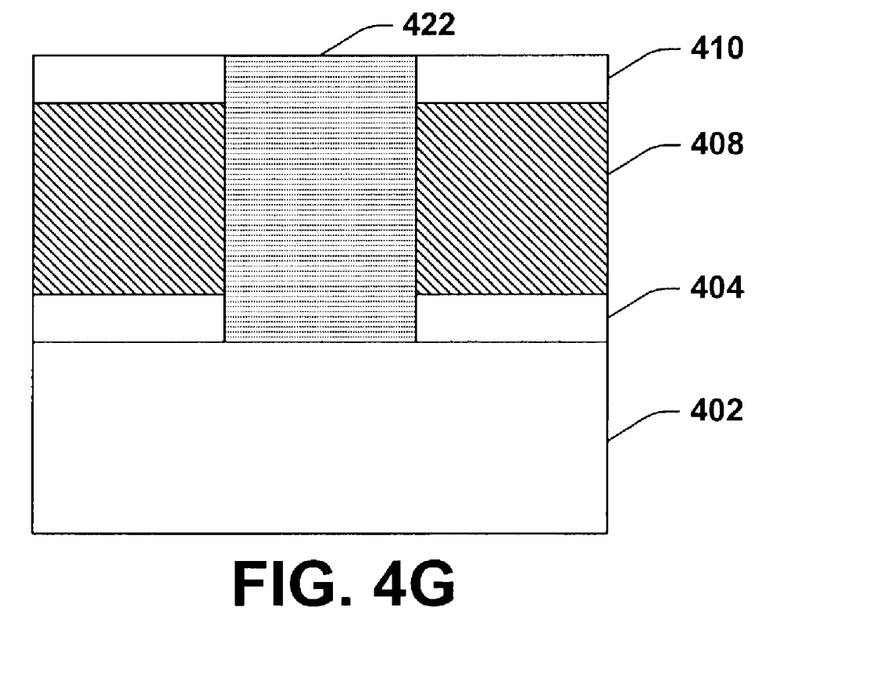

Finally, as described with respect to FIG. 4G, a layer of conductive material 422 is then deposited over the patterned dielectric layer and into the vias or trenches, filling the vias or trenches. Any conductive material 422 on the surface of the cap layer and not in the vias is then removed leaving the desired pattern of interconnects. The excess conductive material 422 not in the trench or via is removed, for example, by CMP or other conventional methods. Removing the conductive material 422 from the surface isolates the patterns within the ILD. The conductive material 422 comprises, for example, copper or other suitable conductive material known in the art.

FIGS. 5 and 6A-6F illustrate an exemplary method for a single inlaid structure according to another embodiment of the present invention. In some embodiments the ESL material is optimized for low dielectric constant values and not limited primarily to etching considerations. In some embodiments a first and second ESL are formed, the first ESL optimized for the stack dielectric constant, the second ESL patterned for etch performance. The second ESL can be deposited and patterned only in critical areas, where the etch rate is fast or the etch selectivity is low and the etch may etch through the ESL. For example, near the die seal or die lithography alignment marks, the ESL can etch faster than in other areas. The portions that etch faster may cause a build-up of electrical charge that in addition to the etch through problem may cause conductor charging and a possible explosion. Therefore, one may want to increase the thickness of the ESL in areas where the etch performs more rapidly.

Figure 5:
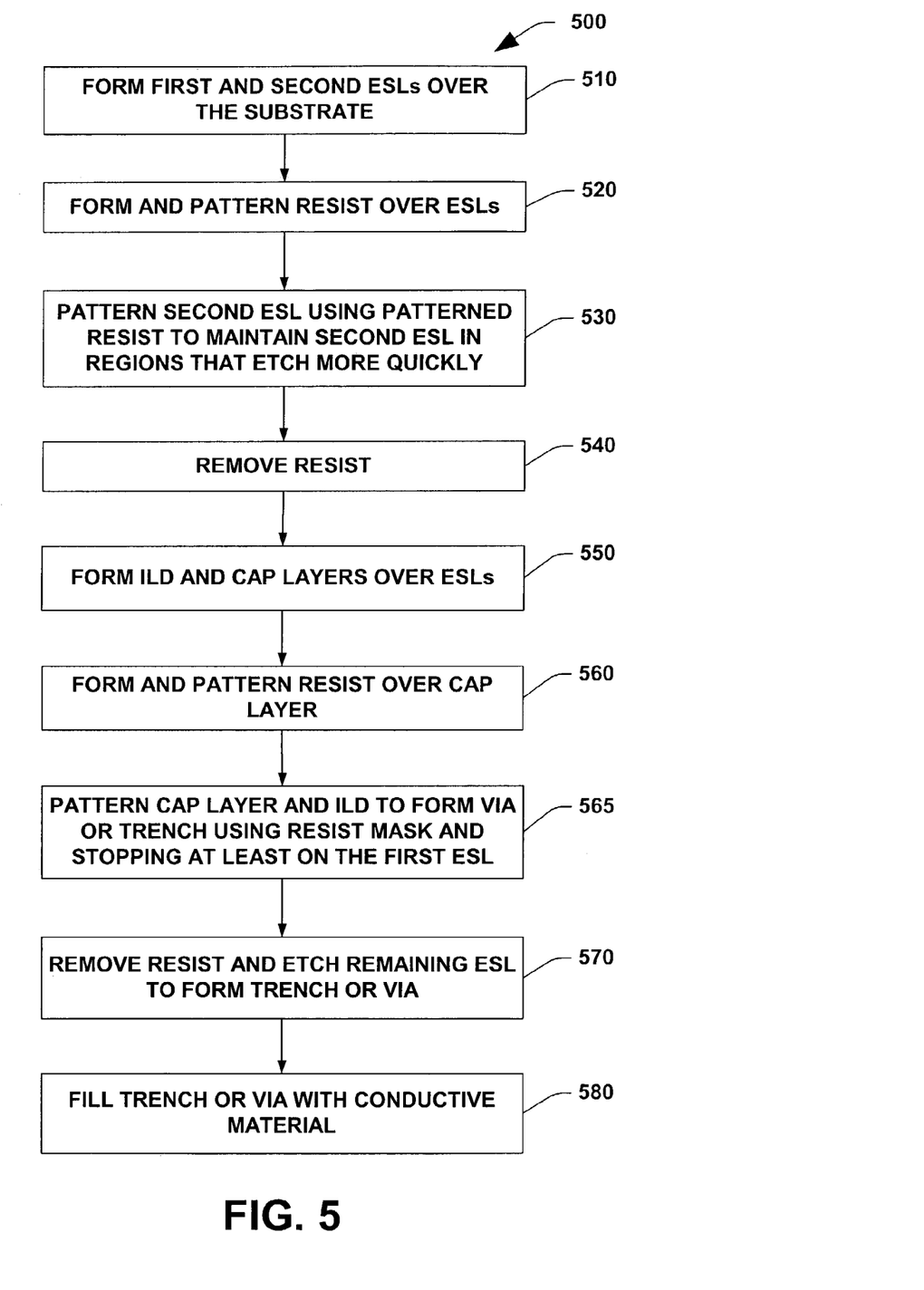
FIG. 5 is a flow chart diagram illustrating an exemplary method for forming a single inlaid structure according to yet another aspect of the present invention.

In FIG. 5, a method 500 is illustrated wherein first and second ESLs are formed over a substrate in succession at 510. A resist is formed thereover and patterned at 520 to define areas where the second ESL should remain. For example, a region near the die seal or near lithography alignment marks may etch more quickly with a traditional etch processing sequence. By etching the second ESL selectively, a portion of the second ESL will remain in one or more areas that tends to etch more quickly. Therefore during subsequent processing, as will be describe in greater detail below, the remaining second ESL portion is available during trench or via patterning to help prevent an undesirable punchthrough into the underlying substrate. The second ESL is then selectively patterned using the resist mask at 530.

The patterned resist is removed at 540, and an ILD and cap layer are formed over the first and second ESLs in succession at 550. Another photoresist is then formed and patterned over the cap layer at 560 to define areas where a trench or via is to be formed. The cap layer and ILD are then patterned at 565 using the patterned resist as a mask. In areas where such an etch tends to occur quickly, both the second and first ESL reside thereat, thereby preventing the etch to extend through the first ESL and thus preventing an undesirable punchthrough condition. In areas where the etch occurs less quickly, the first ESL serves to stop the etch. Thus in both areas, the trench or via etch stops at least on a portion of the first ESL.

The patterned resist is then removed, and the remaining ESL is removed and the trench or via is formed at 570, followed by a filling of the trench or via with a conductive material at 580.

Figure 6A:
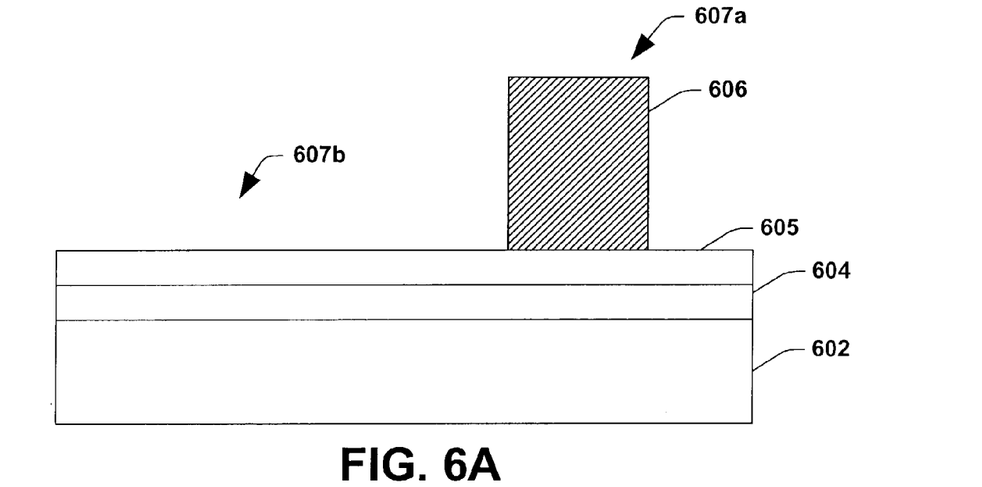
FIGS. 6A through 6F are fragmentary cross section diagrams illustrating an exemplary method for forming a single inlaid structure according to FIG. 5.
Figure 6B:
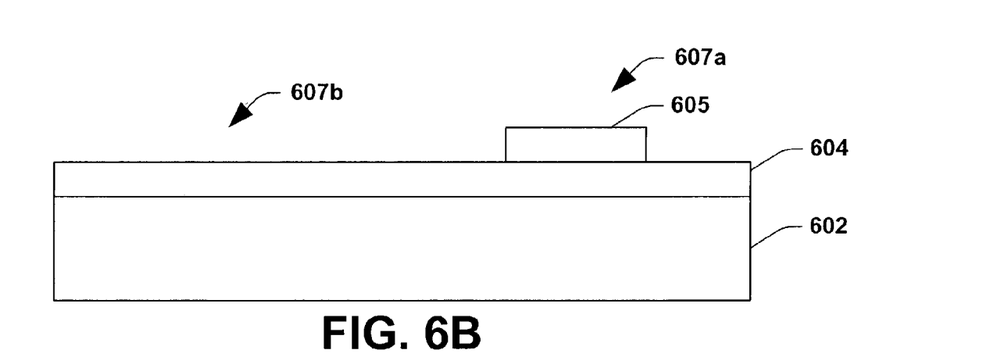

In FIG. 6A a first and second ESL layer, ESL1 604 and ESL2 605, are formed over the substrate 602. A photoresist 606 is then patterned over the ESL2 605 to pattern the ESL2 605 such that the photoresist remains in those areas that etch more quickly. For example, in area 607a, the photoresist 606 remains while in area 607b, the resist is removed although a trench or via will be formed in such locations as well. An ESL2 etch is then performed and the photoresist 606 is stripped away leaving the desired pattern of ESL2 605 on the ESL1 604 as shown in FIG. 6B.

The ESL1 604 and the ESL2 605 may be similar or dissimilar materials with similar or dissimilar etch characteristics. In one example, the ESLs 604/605 may be deposited with greater thickness (e.g., by patterning a second layer) in those areas where the etch performs more quickly. Using multiple or varying thickness ESL offers several advantages over a single uniform thickness ESL. In one example, two different ESL materials with different etch selectivities can be used to allow for accurately stopping an etch at the ESL1 604 when patterning the ESL2 605. Further, in another example, the ESL1 604 has a lower dielectric constant than the ESL2 605, reducing the overall dielectric constant of the stack because only the ESL1 604 will ultimately contribute to the final dielectric constant of the stack and the ESL2 605 will be removed, as will be further appreciated below.

Figure 6C:
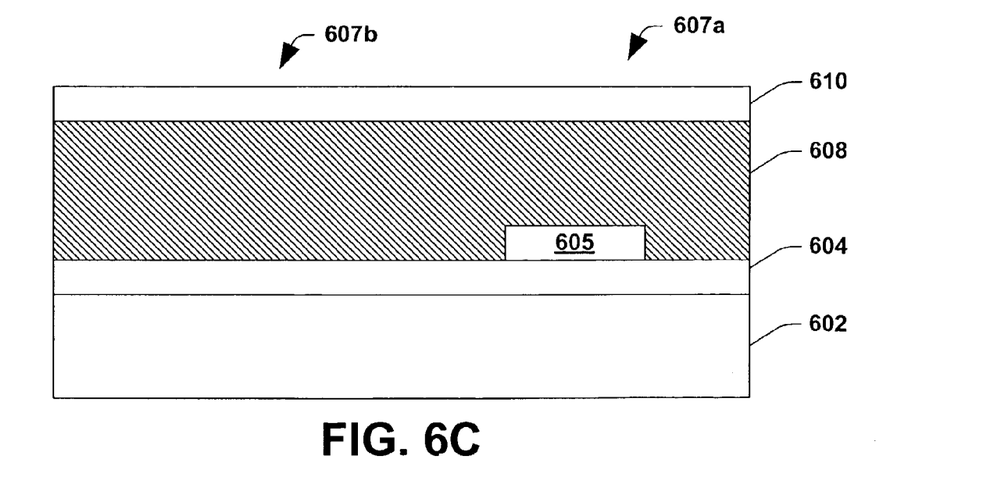
Figure 6D:
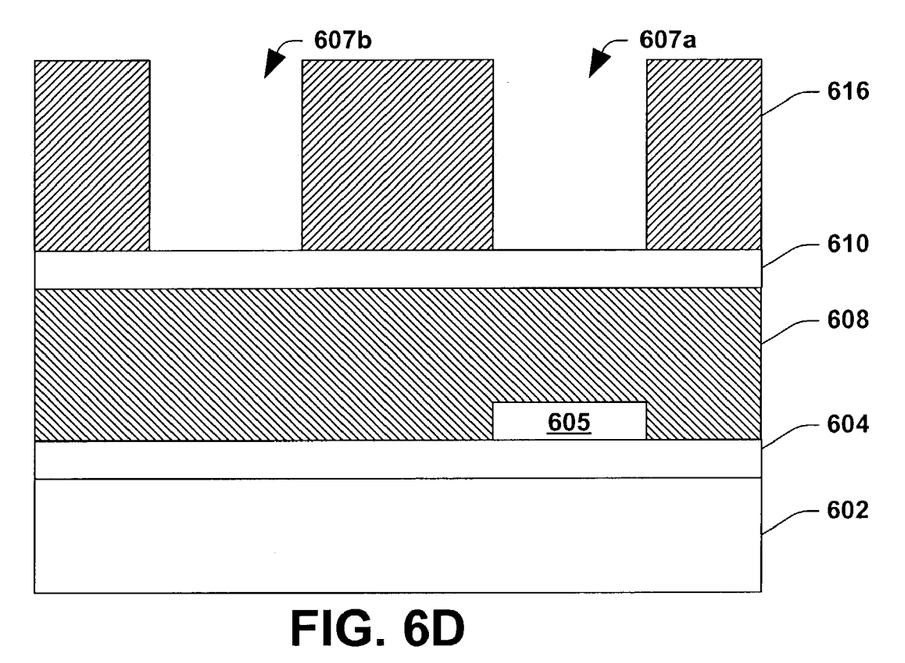

The ILD layer 608 and the cap layer 610 are then deposited over the ESL1 604 and the ESL2 605 in FIG. 6C. These depositions are followed by a photoresist 616 formed and patterned over the cap layer 610 in FIG. 6D. The ILD layer 608, cap layer 610, and photoresist layer 616 can be formed of similar materials as described above in the first and second aspects of the invention described previously.

Figure 6E:
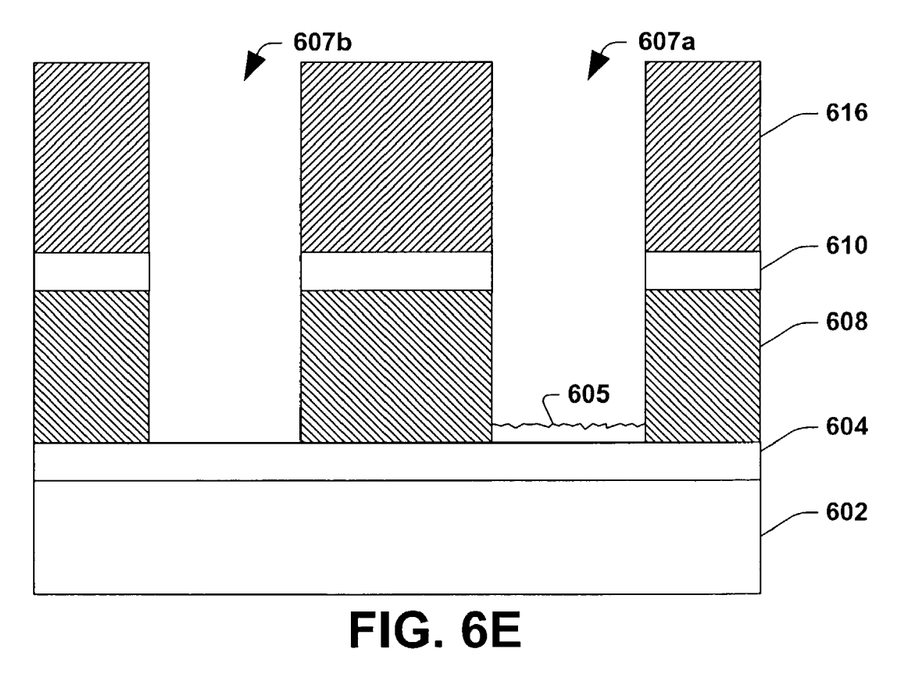

The cap layer 610 and the ILD layer 608 are then etched in FIG. 6E in the areas 607a and 607b to form the vias or trenches. The ESL2 605 in region 607a is formed such that the cap and ILD etch do not etch into the ESL1 604, or at least do not etch completely through ESL1 604. The ESL2 605 may be partially or completely etched during the cap layer 610 and the ILD layer 608 etches.

Figure 6F:
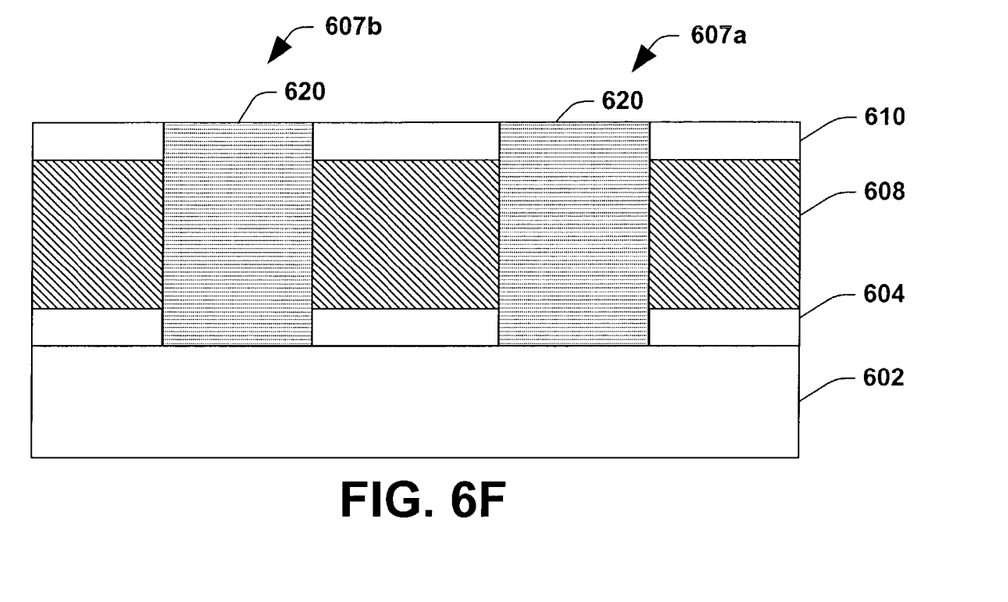

Finally, in FIG. 6F, the photoresist 616 is stripped, and the ESL1 604 and the ESL2 605 (if any) are etched to form a completed via or trench. A conductive material 620, for example, copper, is then deposited in the via and polished back or removed from the surface conventionally.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

We claim:

1. A method for forming an integrated circuit structure comprising:
   forming a first etch stop layer over said integrated circuit structure associated with a substrate;
   forming a second etch stop layer on the first etch stop layer;
   patterning a portion of the second etch stop layer, thereby defining a first region having the first etch stop layer and a second region having the second etch stop layer overlying the first etch stop layer, and wherein the second region is a region that experiences etching at a rate that is greater than the first region, wherein the second etch stop layer is not situated in the first region;
   forming a layer of dielectric material over the first and second regions;
   forming a cap layer over the layer of dielectric material;
   patterning the cap layer and the layer of dielectric material to define two via or trench openings, wherein a first via or trench opening is in the first region and a second via or trench opening is in the second region, and both the first and second via or trench openings extend down to the first etch stop layer;
   removing the first etch stop layer with the first and second via or trench openings; and
   filling the two via or trench openings with a conductive material,
   wherein the cap layer has an optimized thickness.

2. The method of claim 1, wherein patterning a portion of the second etch stop layer comprises:
   forming a photoresist over the second etch stop layer;
   patterning the photoresist to define the first region;
   etching the first region in the second etch stop layer using the patterned photoresist as a mask; and
   removing the patterned photoresist.

3. The method of claim 1, wherein patterning the cap layer and the layer of dielectric material comprises:
   forming a photoresist over the cap layer;
   patterning the photoresist to form two openings therethrough, the openings in the photoresist corresponding to the first region and the second region, respectively;
   etching the cap layer and the layer of dielectric material using the patterned photoresist as a mask; and
   removing the patterned photoresist.

4. The method of claim 1, wherein etching the cap layer and the layer of dielectric material to define the second via or trench opening in the second region is stopped or slowed by the second etch stop layer within the second opening.

5. The method of claim 1, wherein the first and second etch stop layers are of the same material.

6. The method of claim 1, wherein the first and second etch stop layers are of different materials.

7. The method of claim 1, wherein the first and second etch stop layers are of materials having different etch selectivities.

8. The method of claim 1, wherein the first etch stop layer is of a different material having a lower dielectric constant than that of the second etch stop layer.

9. The method of claim 1, further comprising selecting a thickness of the first etch stop layer to prevent subsequent electromigration of the conductive material.

10. A method for forming an integrated circuit structure, comprising:
    forming an etch stop layer over a substrate;
    forming an opening through the etch stop layer;
    forming a barrier layer within the opening of the etch stop layer;
    forming a layer of dielectric material over the etch stop layer and the opening formed therethrough;
    forming a cap layer over the layer of dielectric material;
    patterning the cap layer and the layer of dielectric material to define a via or trench therethrough, the via or trench corresponding generally to the opening in the etch stop layer;
    depositing a conductive material over the cap layer and in the via or trench such that the conductive material fills the via or trench; and
    removing the conductive material that is not situated in the via or trench;
    wherein the cap layer has an optimized thickness.

11. The method of claim 10, further comprising etching a portion of the barrier layer that is exposed through the via or trench.

12. The method of claim 10, wherein the barrier layer comprises tantalum.

* * * * *